(12) United States Patent
Raza et al.

(10) Patent No.: US 7,672,190 B1
(45) Date of Patent: Mar. 2, 2010

(54) INPUT LATCH CIRCUIT AND METHOD

(75) Inventors: Syed Babar Raza, San Jose, CA (US); Nabil Masri, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 195 days.

(21) Appl. No.: 12/001,693

(22) Filed: Dec. 12, 2007

Related U.S. Application Data

(60) Provisional application No. 60/874,382, filed on Dec. 12, 2006.

(51) Int. Cl.
*G11C 8/00* (2006.01)

(52) U.S. Cl. .............................. 365/230.08; 365/230.02; 365/63

(58) Field of Classification Search ............ 365/230.08, 365/230.02, 63
See application file for complete search history.

(56) References Cited

U.S. PATENT DOCUMENTS

| | | | |
|---|---|---|---|
| 5,233,617 A | 8/1993 | Simmons et al. | |
| 5,410,550 A | 4/1995 | Simmons et al. | |
| 5,920,510 A * | 7/1999 | Yukutake et al. | 365/189.05 |
| 6,226,774 B1 | 5/2001 | Sawasaki et al. | |
| 6,262,939 B1 * | 7/2001 | Matsui | 365/233.12 |
| 6,462,998 B1 * | 10/2002 | Proebsting | 365/205 |
| 6,496,403 B2 * | 12/2002 | Noda et al. | 365/63 |
| 6,804,743 B2 * | 10/2004 | Manning | 365/78 |

* cited by examiner

*Primary Examiner*—Tuan T. Nguyen

(57) ABSTRACT

A circuit and method are provided that eliminate race conditions in data storage devices. Generally, the circuit includes: (i) an input latch to which an address signal (ADD) is applied; (ii) a multiplexer (MUX) to which the ADD is coupled from the input latch and through which an output is supplied to an output latch; (iii) an address valid signal (ADV) input coupled to the output latch and to which an ADV is applied to close the output latch supplying the output to a circuit output; and (iv) a middle latch coupled between the input latch and the MUX to hold the ADD applied to the MUX until the output latch closes, independent of a change in the ADD applied to the input latch. Preferably, the circuit includes control logic configured to close the middle latch on a rising edge of ADV and reopen it when the output latch closes.

20 Claims, 4 Drawing Sheets

INPUT LATCH CIRCUIT AND METHOD

CROSS-REFERENCE TO RELATED APPLICATIONS

The present application claims the benefit of priority under 35 U.S.C. 119(e) to U.S. Provisional Patent Application Ser. No. 60/874,382 entitled "A Circuit and Method to Eliminate Race Conditions By Design," filed Dec. 12, 2006, which application is hereby incorporated by reference in its entirety.

TECHNICAL FIELD

The present invention relates generally to semiconductor data storage devices, and more particularly to a circuit and method to eliminate race conditions in a device that supplies an output based on an input.

BACKGROUND OF THE INVENTION

Semiconductor data storage devices, such as semiconductor memories and registers, typically access or output multiple-bit stored data in response to an applied signal or signals.

A race condition is a problem that can be caused in such a devices when there is a difference between a speed at which an address signal (ADD) input to the device is transmitted and the speed at which an address valid (ADV) signal and the data is transmitted. This difference in speed arises from design constraints of the integrated circuit (IC) or chip, and the different paths over which the signals propagate. Typically, a time margin equal to or greater than the worst case difference is added to the access time to ensure that all switching of signals has ended before an output signal is latched or data read.

The general state of the art with respect to solving the race condition problem may be understood with reference to the circuit 100 illustrated in FIG. 1. Referring to FIG. 1, ADD and ADV signals are applied to an input latch 102 and logic device 104 as shown. The address signal (ADD) is latched on a rising edge of the ADV signal. Data from one or more data storage elements 106 is provided to an output latch 108 though a multiplexer (MUX 110), and is typically updated from a different clock domain and synchronized with respect to ADV on the output of the logic elements or device 104. New ADD and ADV signals are then applied to get next data.

One problem with the above conventional approach is a "race condition" arises in which synchronization delays and a pulse width of the ADV signal can cause differences between ADD and ADV signals resulting in the wrong data 106 being driven out of the output latch device 108. A conventional approach to avoiding or minimizing this race condition is to take a worst case delay for synchronization of the ADD and ADV signals as a reference delay and generating a clock or a control signal based on this reference delay to gate the circuits to be selected, thereby providing a hold condition constraint for the output latch.

Typically, these timing constraints are calculated and applied late in the design cycle during a physical design stage, affecting other unrelated physical design activities, and requiring numerous iterations.

Accordingly, there is a need for a circuit and method of using the same that substantially eliminates race conditions and the uncertainty associated therewith by design. It is further desirable that the circuit and method eliminate costs and delays incurred through repeated calculation and application of timing constraints late in the design cycle.

SUMMARY OF THE INVENTION

The present invention provides a solution to these and other problems, and offers further advantages over conventional circuits and methods.

In one aspect, the present invention is directed to a circuit for supplying an output based on an input. The circuit comprises: (i) an input latch to which an address signal (ADD) is applied; (ii) a multiplexer (MUX) to which the ADD is coupled from the input latch and through which the output is supplied to an output latch from a storage device in response to the ADD; (iii) an address valid signal (ADV) input coupled to the output latch and to which an ADV is applied to close the output latch supplying the output from the MUX to a circuit output in response to the ADV; and (iv) a middle latch coupled between the input latch and the MUX to hold a value of the ADD applied to the MUX until the output latch closes, independent of a change in value of the ADD applied to the input latch.

Generally, the circuit further includes control logic coupled to the middle latch to control operation thereof. Preferably, the control logic is further coupled to the ADV input and the control logic is configured to close the middle latch on a rising edge of the ADV. More preferably, the circuit further includes output latch logic through which the ADV is coupled to open and close the output latch and the control logic is also coupled to the output latch logic to open the middle latch when the output latch closes.

In certain embodiments, the circuit is a latching circuit that eliminates race conditions in data storage devices by holding or maintaining a value of the address signal applied to the multiplexer until the output latch closes. Data storage devices for which the latching circuit is particularly useful include, for example, semiconductor memories and registers.

In another aspect, the present invention is directed to a method of operating a circuit to supply an output based on a number of input signals. In one embodiment, the method comprises steps of: (i) applying an address signal (ADD) to an input latch of the circuit; (ii) coupling a value of the ADD applied through the input latch to a multiplexer (MUX); (iii) holding the value of the ADD applied to the MUX independent of a change in value of the ADD applied to the input latch; and (iv) applying an address valid signal (ADV) to an output latch of the circuit to close the output latch supplying the output from a storage device through the MUX in response to the ADD to a circuit output.

In certain embodiments, the circuit further includes a middle latch coupled between the input latch and the MUX, and the steps of coupling and holding the value of the applied ADD to the MUX comprise the step of closing the middle latch on a rising edge of the ADV. Preferably, the method further includes the step of opening the middle latch when the output latch closes.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to a circuit and method to eliminate race conditions in a device that supplies an output based on an input.

The circuit and method of present invention are particularly suitable for use with data storage devices such as semiconductor memories and registers.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The terms "to couple" and "to electrically couple" as used herein may include both to directly connect and to indirectly connect through one or more intervening components.

Briefly, the circuit of the present invention includes additional control logic and a second or middle latch following a first or input latch to ensure proper sequencing of latch operations and eliminate hold requirements between the input latch and a data or output latch.

Figure 1:
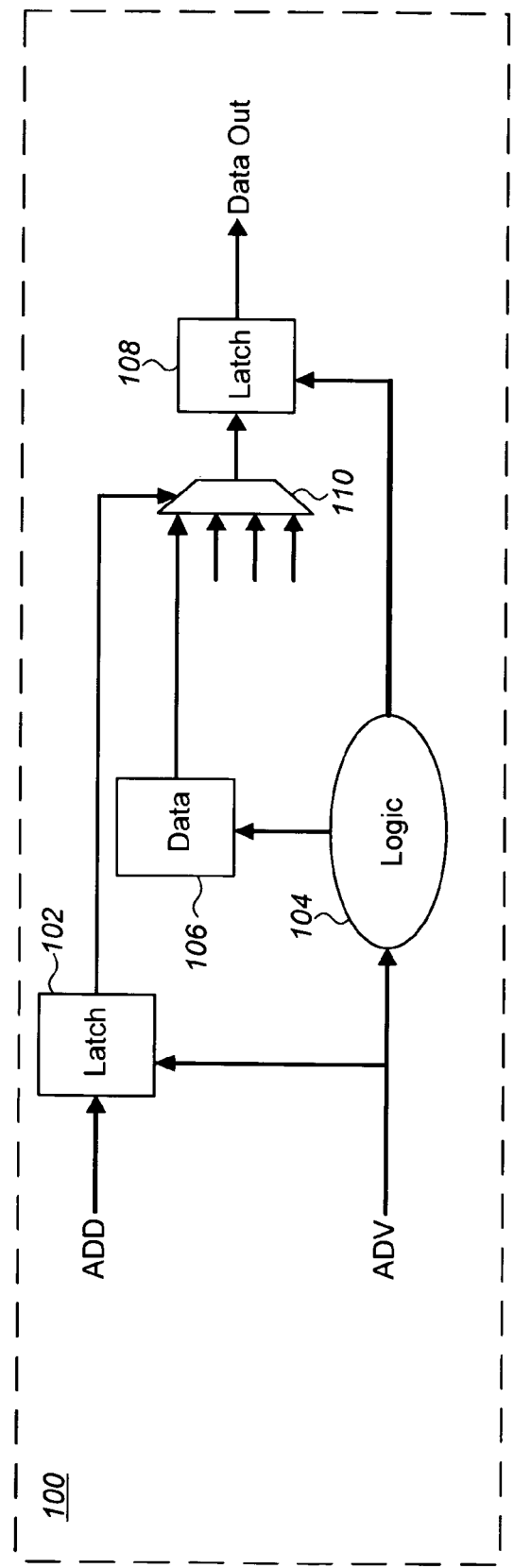
FIG. 1 is a block diagram of a conventional circuit for accessing a data storage device device.
Figure 2A:
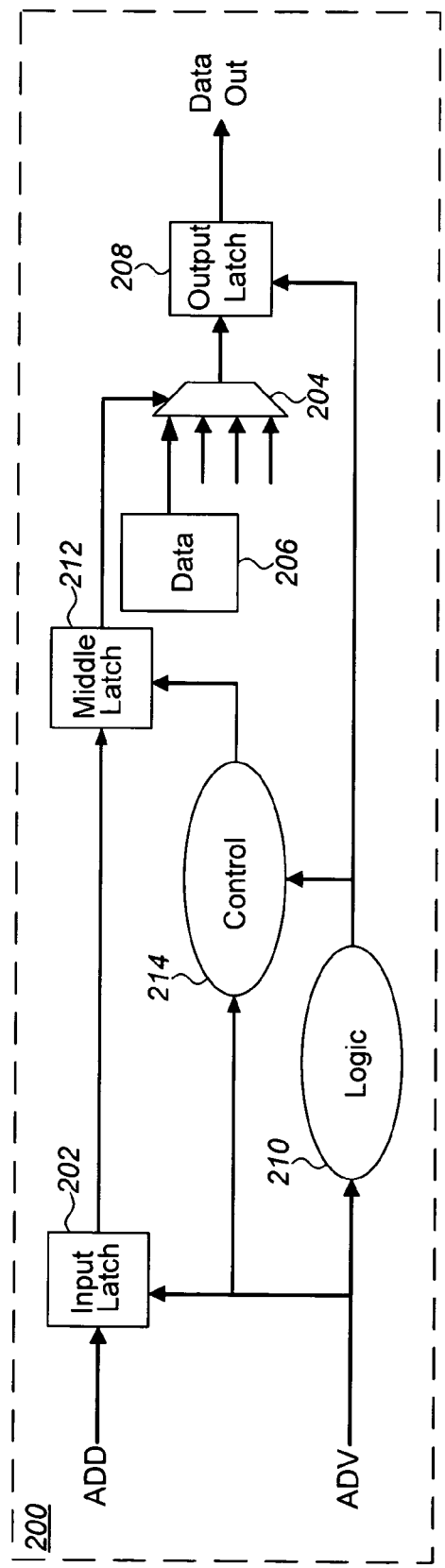
FIG. 2A is a block diagram of a circuit according to an embodiment of the present invention for eliminating race conditions in a high speed device that supplies an output based on an input.

The circuit and methods for operating the same according to various embodiments of the present invention will now be described in detail with reference to FIGS. 2A and 2B. For purposes of clarity, many of the details of integrated circuit (IC) design in general and design of semiconductor data storage devices in particular that are widely known and are not relevant to the present invention have been omitted from the following description.

In one embodiment, the circuit 200 generally includes an input latch 202 to which an address signal (ADD) is applied, and a multiplexer (MUX 204) coupled to the input latch and through which an output or data from a number of data storage elements, such as a register or semiconductor memory, in a data storage device (DATA 206) is supplied to an output latch 208 in response to the ADD. An address valid signal (ADV) is also coupled to the input latch 202 and, through ADV or output latch logic (Logic 210) to the output latch 208 to close the latch when the ADV is applied, thereby supplying data through the MUX 204 to an output of the output latch in response to the ADV.

In accordance with the present invention, the circuit further includes a middle latch 212 coupled between the input latch 202 and the MUX 204 to hold a value of the ADD applied to the MUX until the output latch 208 closes, independent of any change in value of the ADD applied to the input latch. Generally, the middle latch 212 is functionally similar to if not substantially identical with the first latch 202 preceding it. However, it will be appreciated that certain characteristics including size and electrical characteristics of the second latch 212 may be selected to optimize operation of the circuit 200.

Preferably, the circuit 200 further includes control logic or a sub-circuit (control 214) having a number of control elements coupled to the middle latch 212 to control operation thereof. More preferably, the control logic 214 is further coupled to the ADV input and to the output latch logic 210, and is configured to close the middle latch 212 on a rising edge of the ADV and reopen the middle latch when an output latch control signal from the output latch logic closes the output latch 208. The output latch control signal is a synchronous or internally generated ADV signal from the output latch logic 210.

Figure 2B:
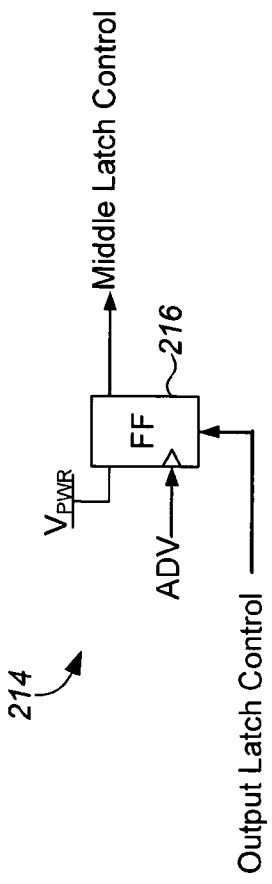
FIG. 2B is a detailed block diagram of a control logic sub-circuit in the circuit of FIG. 2A according to an embodiment of the present invention.

In one embodiment, shown in the detail of FIG. 2B, the control logic (Control 214) comprises a flip-flop (FF 216), such as a D-type FF or DFF, configured to be set by the rising edge of ADV to close the middle latch 212, and to be cleared by the output latch control signal from the output latch logic 210.

Figure 3:
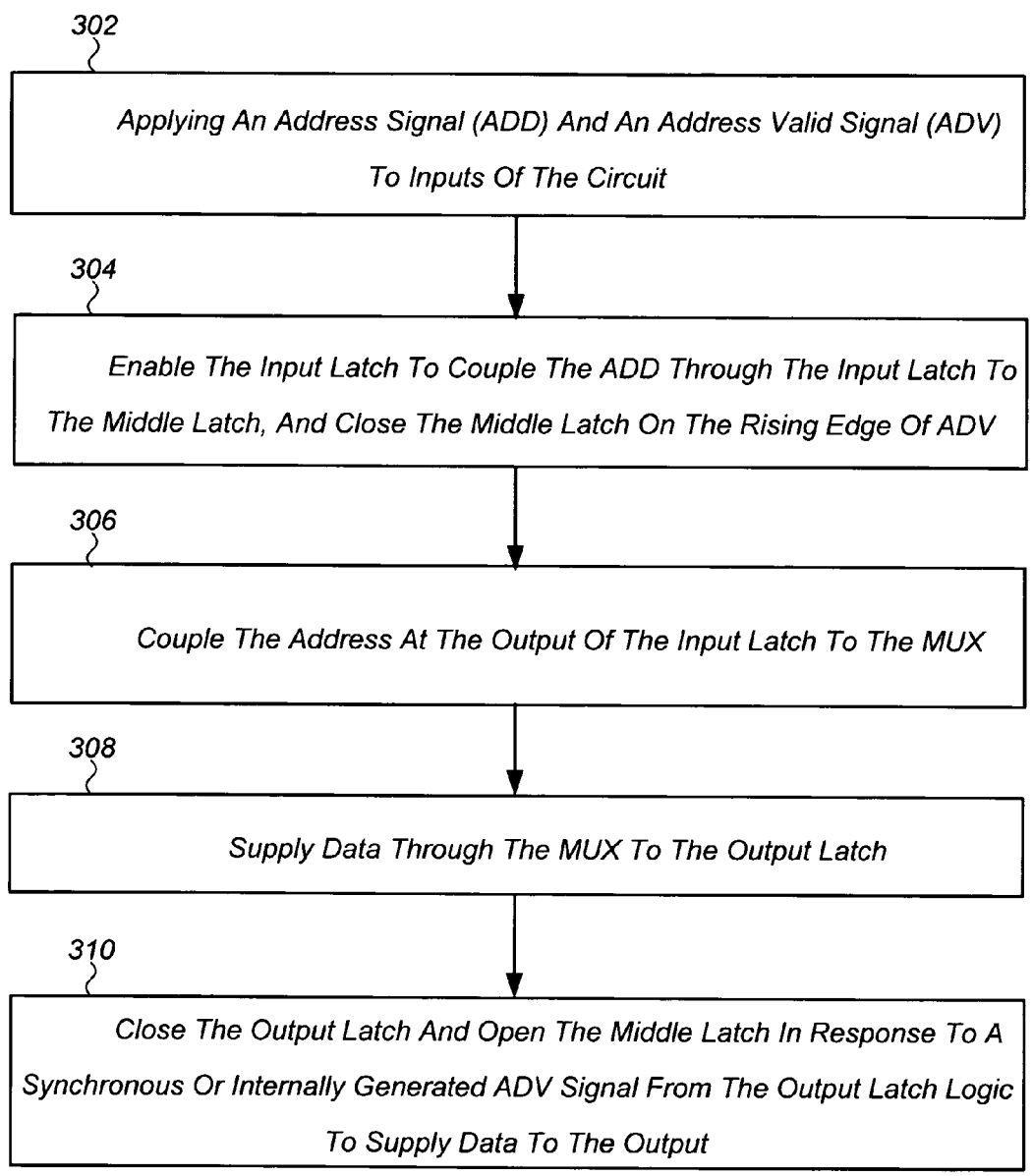
FIG. 3 is a flowchart of a method according to an embodiment of the present invention for operating a circuit to eliminate race conditions in a device that supplies an output based on an input.
Figure 4:
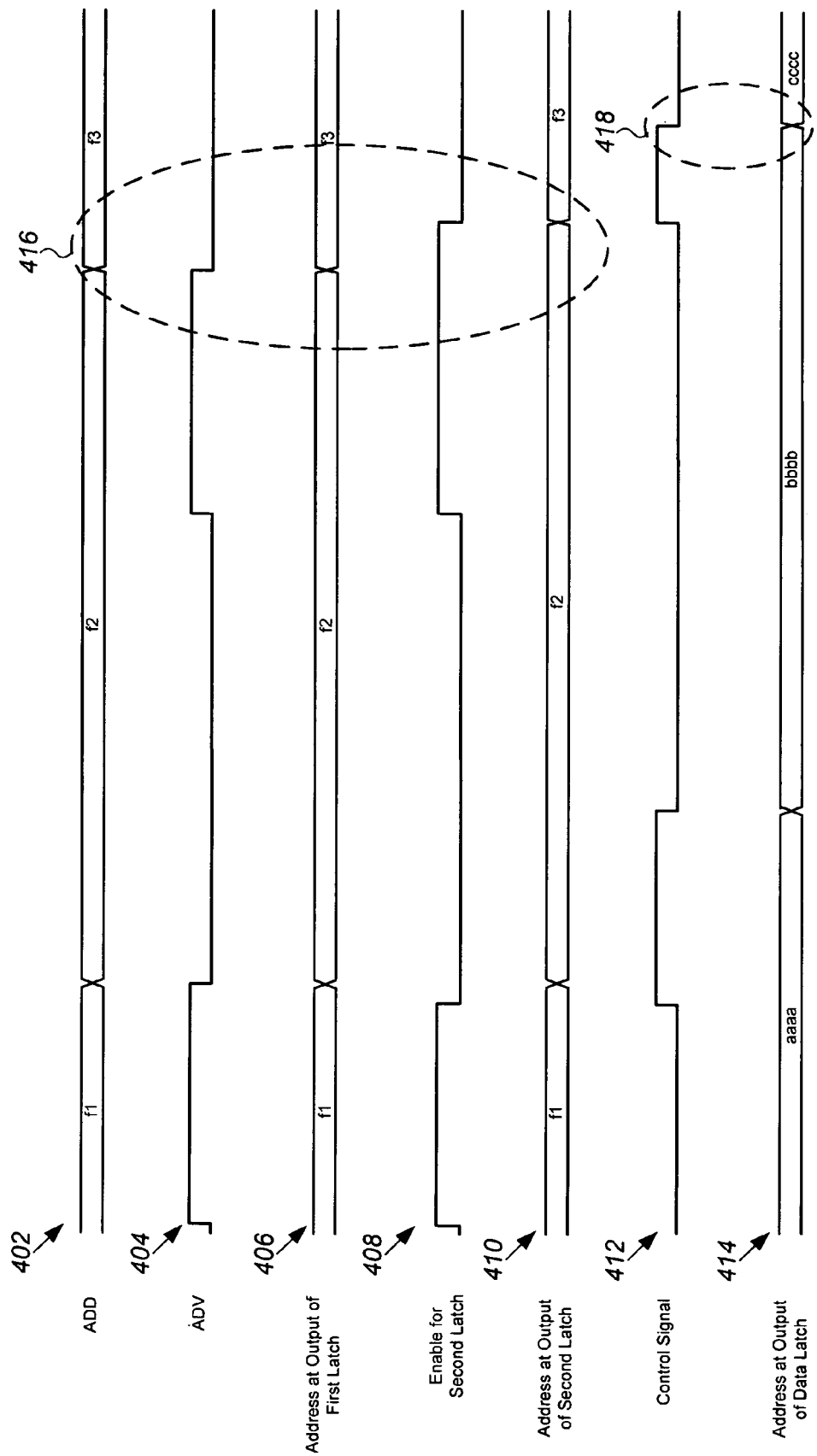
FIG. 4 is a timing diagram for input and output signals of the circuits of FIGS. 2A and 2B.

A method or sequence of operating the circuit of FIGS. 2A and 2B according to an embodiment of the present invention will now be described with reference to FIGS. 3 and 4. FIG. 3 is a flowchart of a method according to an embodiment of the present invention for operating a circuit to eliminate race conditions in a device that supplies an output based on an input. FIG. 4 is an exemplary timing diagram for input and output signals of the circuits of FIGS. 2A and 2B, and includes separate traces illustrating input signals to and output from the circuit. In particular, trace 402 labeled ADD illustrates the address signal applied at the input of the input latch 202. Trace 404 labeled ADV illustrates the address valid signal that controls the enable of the input latch 202, and also closes the middle latch 212 for the address at the output of the input latch, shown in the third trace 406, and labeled Address at Output of First Latch. The fourth trace 408, labeled enable For Second Latch, illustrates an enable signal for the middle latch 212 originating from the control logic 214 in FIG. 2A. A fifth trace 410, labeled Address at Output of Second Latch, illustrates the address at the output of the middle latch. Trace 412 labeled Control Signal illustrates a control signal originating from the output latch logic (Logic 210 in FIG. 2A), which closes the output latch 208 and opens the middle latch 212. Trace 414, labeled Address at Output of Data Latch, illustrates the output of the output latch 208.

Referring to FIGS. 3 and 4, the method begins with applying an address signal (ADD) and an address valid signal (ADV) to inputs of the device or circuit (step 302). In a second step, step 304, the ADV controls the enable of the input latch 202 to couple the ADD through the input latch to the middle latch 212, and, through the control logic (Control 214 in FIG. 2A), to close the middle latch on the rising edge of the ADV. The address at the output of the input latch 202, shown in trace 406, is coupled to the MUX 204 (step 306). Data is supplied through the MUX 204 to the output latch 208 (step 308), which is closed in response to a synchronous or internally generated control signal, shown in trace 412, from the logic 210 to supply data through the output latch to the circuit output while simultaneously opening the middle latch 212 (step 310).

It will be appreciated that as shown in the area enclosed by dashed line 416, after the second latch is closed on the preceding rising edge of ADV, the address at the input of the second latch, also the address at the output of the first latch (trace 406), changes but the address at the output of the second latch (trace 410) does not. Thus, when the second latch is closed, the value or address of the ADD signal applied to the input of the circuit (trace 402) can be changed substantially without changing the output of the circuit or device.

It will further be appreciated that as shown in the area enclosed by dashed line 418, the data at the output of the data latch does not change until the control signal goes low.

A significant advantage of the circuit and method of the present invention over previous or conventional methods is that race conditions are eliminated by circuit design rather than by back-end timing requirements. Additional advantages include: (i) elimination of the need to calculate and apply timing constraints late in the design cycle; (ii) elimination of the need for repeated iterations calculating and applying the timing constraints late in the design cycle, when they are impacted by other unrelated design or fabrication activities; and (iii) reduced design cycle time and reduced costs associated therewith.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A circuit for supplying an output based on an input, the circuit comprising:
    an input latch to which an address signal (ADD) is applied;
    a multiplexer (MUX) to which the ADD is coupled from the input latch and through which the output is supplied to an output latch from a storage device in response to the ADD;
    an address valid signal (ADV) input coupled to the output latch and to which an ADV is applied to close the output latch supplying the output from the MUX to a circuit output in response to the ADV; and
    a middle latch coupled between the input latch and the MUX to hold a value of the ADD applied to the MUX until the output latch closes, independent of a change in value of the ADD applied to the input latch.

2. A circuit according to claim 1, further comprising control logic coupled to the middle latch to control operation thereof.

3. A circuit according to claim 2, wherein the control logic is further coupled to the ADV input.

4. A circuit according to claim 3, wherein the control logic is configured to close the middle latch on a rising edge of the ADV.

5. A circuit according to claim 4, further comprising output latch logic through which the ADV is coupled to open and close the output latch.

6. A circuit according to claim 5, wherein the control logic is further coupled to the output latch logic, and wherein the control logic is configured to open the middle latch when the output latch closes.

7. A circuit according to claim 6, wherein the control logic comprises a flip-flop (FF) set on the rising edge of the ADV to close the middle latch and cleared by an output latch control signal from the output latch logic to open the middle latch.

8. A circuit according to claim 7, wherein the FF comprises a D-type FF (DFF).

9. A circuit according to claim 1, wherein the storage device comprises a number of data storage elements.

10. A circuit according to claim 8, wherein the number of data storage elements comprise a semiconductor memory.

11. A method for operating a circuit to supply an output based on input, the method comprising steps of:
    applying an address signal (ADD) to an input latch of the circuit;
    coupling a value of the ADD applied through the input latch to a multiplexer (MUX);
    holding the value of the ADD applied to the MUX independent of a change in value of the ADD applied to the input latch; and
    applying an address valid signal (ADV) to an output latch of the circuit to close the output latch supplying the output from a storage device through the MUX in response to the ADD to a circuit output.

12. A method according to claim 11, wherein the circuit further comprises a middle latch coupled between the input latch and the MUX, and wherein the steps of coupling and holding the value of the applied ADD to the MUX comprise the step of closing the middle latch on a rising edge of the ADV.

13. A method according to claim 12, further comprising the step of opening the middle latch when the output latch closes.

14. A latch circuit for eliminating race conditions in a data storage device, the circuit comprising:
    an input latch to which an address signal (ADD) is applied;
    a multiplexer (MUX) to which the ADD is coupled from the input latch and through which data is supplied from the data storage device to an output latch in response to the ADD;
    an address valid signal (ADV) input coupled to the output latch and to which an ADV is applied to close the output latch supplying the data from the MUX to a circuit output in response to the ADV;
    a middle latch coupled between the input latch and the MUX; and
    control logic coupled to the middle latch to control operation thereof to hold a value of the ADD applied to the MUX until the output latch closes, independent of a change in value of the ADD applied to the input latch.

15. A circuit according to claim 14, wherein the control logic is further coupled to the ADV input and is configured to close the middle latch on a rising edge of the ADV.

16. A circuit according to claim 15, further comprising output latch logic through which the ADV is coupled to open and close the output latch.

17. A circuit according to claim 16, wherein the control logic is further coupled to the output latch logic, and wherein the control logic is configured to open the middle latch when the output latch closes.

18. A circuit according to claim 17, wherein the control logic comprises a flip-flop (FF) set on the rising edge of the ADV to close the middle latch and cleared by an output latch control signal from the output latch logic to open the middle latch.

19. A circuit according to claim 14, wherein the storage device comprises a semiconductor memory.

20. A circuit according to claim 19, wherein the storage device comprises a register.

* * * * *